United States Patent [19]

Hasegawa

[11] Patent Number: 4,996,009

[45] Date of Patent: Feb. 26, 1991

[54] PREPARATION OF CARBON MICROBALLOONS

[75] Inventor: Kazuhiro Hasegawa, Chiba, Japan

[73] Assignee: Kawasaki Steel Corporation, Kobe, Japan

[21] Appl. No.: 307,614

[22] Filed: Feb. 8, 1989

Related U.S. Application Data

[63] Continuation-in-part of Ser. No. 256,073, Oct. 7, 1988, abandoned, which is a continuation of Ser. No. 22,525, Mar. 9, 1987, abandoned, which is a continuation of Ser. No. 748,613, Jun. 25, 1985, abandoned.

[30] Foreign Application Priority Data

Jun. 26, 1984 [JP] Japan ................................ 59-131767

[51] Int. Cl.$^5$ ............................ C01B 31/02; B29B 9/10
[52] U.S. Cl. ........................................ 264/5; 208/45; 264/12; 264/29.1; 423/445; 423/449
[58] Field of Search ............... 264/12, 15, 29.1, 29.5, 264/29.7, 44, 53, 5; 423/449, 445; 208/45

[56] References Cited

U.S. PATENT DOCUMENTS

| Re. 29,101 | 1/1977 | Amagi et al. | 423/449 |
|---|---|---|---|
| 3,786,134 | 1/1974 | Amagi et al. | 423/449 |
| 3,830,740 | 8/1974 | Amagi et al. | 264/29.1 |
| 3,937,775 | 2/1976 | Horikiri et al. | 264/29.1 |
| 4,009,232 | 2/1977 | Skiiki et al. | 264/9 |
| 4,025,689 | 5/1977 | Kobayashi et al. | 428/402 |
| 4,228,037 | 10/1980 | Hino et al. | 264/29.1 |
| 4,273,675 | 6/1981 | Shiiki | 264/29.1 |
| 4,371,454 | 2/1983 | Hisatsugu et al. | 264/29.1 |
| 4,420,443 | 12/1983 | Kaji et al. | 264/15 |
| 4,637,906 | 1/1987 | Fukuda et al. | 264/29.1 |
| 4,758,326 | 7/1988 | Ohsugi et al. | 208/45 |

FOREIGN PATENT DOCUMENTS

| 59-161483 | 9/1984 | Japan | 208/45 |
|---|---|---|---|
| 2103650 | 2/1983 | United Kingdom . | |
| 2112411 | 7/1983 | United Kingdom . | |

Primary Examiner—Mary Lynn Theisen
Attorney, Agent, or Firm—Young & Thompson

[57] ABSTRACT

A novel process for preparing spherical carbon microballoons is disclosed. In this process, a pitch is admixed with a low-boiling organic solvent to form a pitch-solvent mixture; the pitch-solvent mixture is pulverized and flash heated at a temperature higher than the boiling point of the low-boiling organic solvent to form hollow, spherical carbon microballoons; and the carbon microballoons are rendered infusible and then sintered. The formation of hollow, spherical carbon microballoons at high yield is enabled by using a particular pitch containing 40 to 65% by weight of benzene insoluble components and up to 0.1% by weight of quinoline insoluble components, and having a softening point in the range of 60° to 320° C.

4 Claims, 3 Drawing Sheets

FIG. 3a
PARTICLE SIZE: 149 μm
FIG. 3b
PARTICLE SIZE: 250 μm
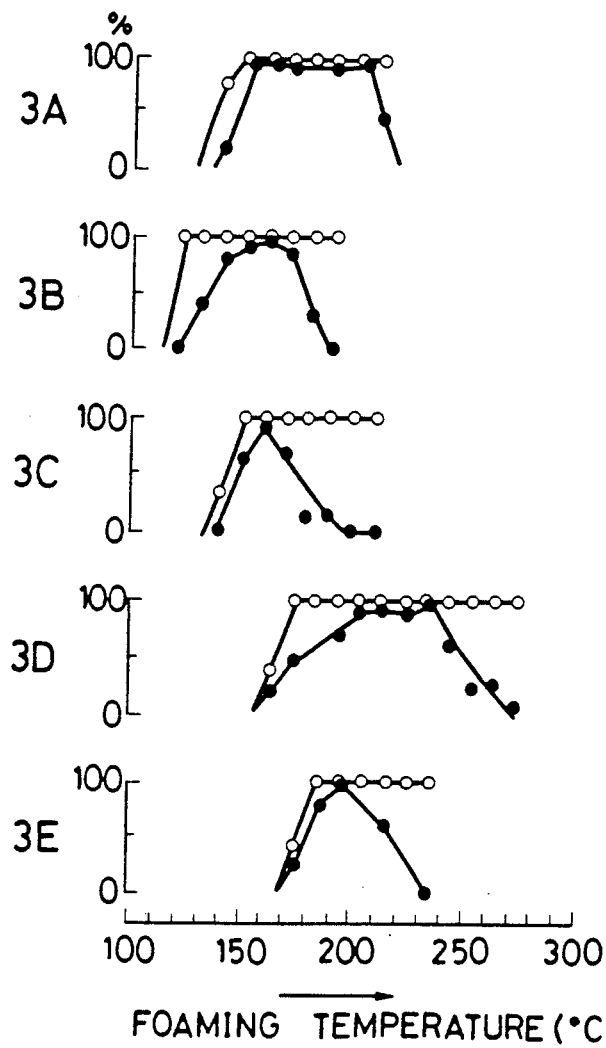
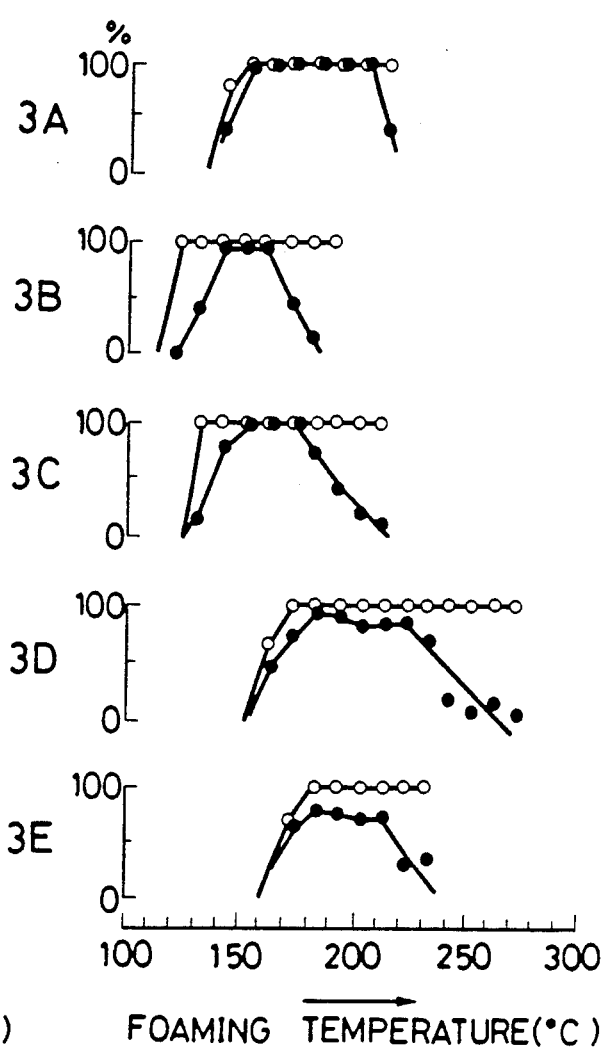
○ PERCENTAGE OF FOAMING
● PERCENTAGE OF SPHERICAL MICROBALLOON

PREPARATION OF CARBON MICROBALLOONS

This is a continuation-in-part of application Ser. No. 07/256,073, filed Oct. 7, 1988, now abandoned, which is a continuation of Ser. No. 07/022,525, filed Mar. 9, 1987, now abandoned, which is a continuation of Ser. No. 06/748,613, filed June 25, 1985, now abandoned.

BACKGROUND OF THE INVENTION

This invention relates to a process for preparing carbon microballoons by starting with a particular pitch in admixture with a low-boiling organic solvent as a foaming agent.

Carbon microballoons are highly valued as lightweight carbon materials having heat resistance, chemical resistance and other advantages which give them wide utility as low-temperature thermal insulators, composite materials with metal or inorganic matter, nuclear reactor materials, electroconductive plastic materials, and the like.

The preparation of carbon microballoons is disclosed in Y. Amagi et al., U.S. Pat. No. 3,786,134 (Japanese Pat. Publication No. 49-30253); Japanese Pat. Publication Nos. 50-29837 and 54-10948.

Y. Amagi et al., U.S. Pat. No. 3,786,134 (Japanese Pat. Publication No. 49-30253) discloses a preparation of pitch microballoons by homogeneously mixing a hard, highly aromatic pitch having a softening point of 60° to 350° C., a 0-25% nitrobenzene-insoluble moiety and a hydrogen/carbon atomic ratio of 0.2 to 1.0 with a low-boiling organic solvent, dispersing the mixture into water in the presence of a protective colloid, adjusting the content of the solvent in the resulting microspheres to 0.2 to 10%, flash heating said microspheres whereby the solvent therein functions as blowing agent to form hollow pitch microspheres, and rendering the microspheres infusible by heating them with an oxidizing fluid, and baking to carbonization at a temperature of 600° to 2,000° C. in an inert atmosphere. The pitch as specified-above used in Amagi is selected since the use of a pitch having a softening point above 350° C. or a more than 25% nitrobenzene-insoluble moiety does not result in uniform hollow microspheres because such pitch is hardly mixed homogeneoulsly with a low-boiling organic solvent, thus causing a heterogeneous dispersion and uneven foaming. In Amagi, the pitchs which fulfill the desired requirements are those obtained by removing low-molecular weight components by distillation or extraction.

As described above, the pitch used in Amagi is a particular hard, highly aromatic pitch containing free carbon as well as high-molecular weight components such as mesophase pitch unremoved therefrom. When such a pitch is used for the preparation of carbon microballoons, it is impossible to simultaneously render the pitch-solvent mixture particles hollow and spherical in a single step of flash heating. Amagi, therefore, employed two separate steps of dispersing the pitch-solvent mixture particles in hot water to make them spherical, and flash heating the already spherical particles to foam and make them hollow.

More illustratively, the pitch used in Amagi containing the high-molecular weight components unremoved therefrom are incompatible with the low-boiling organic solvent, and are unable to homogeneously mix with the low-boiling organic solvent. Therefore, the pitch-solvent mixture particle prepared from the pitch of Amagi would not foam into a spherical microballoon unless the pitch-solvent mixture particle is rendered spherical by the dispersion prior to the foaming step.

Moreover, a pitch having a high softening point is particularly difficult to homogeneously mix with the low-boiling organic solvent. When such a pitch is used for the preparation of the carbon microballoons, the pitch needs to be admixed with an excess amount of the solvent. After the dispersion into hot water, the content of the solvent should be adjusted prior to the foaming step, since yield of the spherical carbon microballoons would be markedly reduced without such an adjustment of the solvent content.

The method disclosed in Japanese Pat. Publication No. 50-29837 can only produce microballoons of a limited size. The microballoons prepared by such a methods, despite their many improved properties, have not found a wide variety of applications because of the expense due to the complexity of the methods.

The method disclosed in Japanese Pat. Publication No. 54-10948 produces microballoons which are not completely spherical in shape and often have cracks in their shell.

A method for producing solid spherical particles of carbon and of activated carbon is described in H. Kaji et al., U.S. Pat. No. 4,420,443. In this method, a mixture of a pitch and a viscosity-reducing agent is melt extruded into a form of string-like, bodies which is broken into stick-like bodies, and these stick-like bodies are thermally deformed in hot water into spherical particles from which the viscosity-reducing agent is removed to obtain spherical, but solid particles of carbon or activated carbon. This method, however, does not provide hollow carbon microballoons.

A method for producing solid spherical particles of carbon is also disclosed in Z. Shiiki et al., U.S. Pat. No. 4,273,675. In this method, a pitch is mixed with a viscosity-reducing organic solvent, a softening point-elevating agent, and a void formation-preventing agent, and the mixture is then fused and shaped into spherical, but solid particles.

Although these two methods by Kaji and Shiiki disclose the preparation of the solid, spherical carbon microspheres, an additional troublesome step of adjusting the solvent content as disclosed in Amagi would be required to further foam these solid, spherical carbon microspheres into the hollow carbon microballoons.

Consequently, although the above-described prior art methods may disclose independent processes for the preparation of the spherical, solid carbon microspheres and the preparation of the hollow, spherical carbon microballoons, these processes can not be readily combined to realize a single flash heating step wherein spherical hollow carbon microballoons are formed from irregularly shaped pitch-solvent particles.

Inventors of the present invention have found that these processes can simultaneously be carried out in a single flash heating step when the pitch used in the preparation of the carbon microballoons are free of free carbon and high-molecular weight components such as mesophase pitch and spherulites.

SUMMARY OF THE INVENTION

It is, therefore, an object of the present invention to provide a novel process capable of preparing carbon microballoons in an easy and economic fashion without the disadvantages of the prior art.

According to the present invention, there is provided a process for preparing carbon microballoons, comprising the steps of:

admixing a pitch with a low-boiling organic solvent to form a pitch-solvent mixture, said pitch containing 40 to 65% by weight of BI (benzene insoluble) components and up to 0.1% by weight of QI (quinoline insoluble) components, and having a softening point in the range of 60° to 320° C.;

forming said pitch-solvent mixture into irregularly-shaped particles having a granulometry comprised between 4 mesh (4,760 μm) and 425 mesh (32 μm);

flash heating said irregularly-shaped particles at a temperature higher than the boiling point of said low-boiling organic solvent to cause foaming, whereby expansion pressure of said solvent and surface tension of said particles coact to form hollow, spherical carbon microballoons;

treating said microballoons with an oxidizing gas or liquid to make them infusible; and sintering the infusible microballoons in a non-oxidizing atmosphere for carbonization.

BRIEF DESCRIPTION OF THE DRAWINGS

The above and other objects, features, and advantages of the present invention will be more fully understood by reading the following description when taken in conjunction with the accompanying drawings, in which:

FIG. 3 is a diagram illustrating percentage of foaming as well as percentage of spherical microballoons in relation to foaming temperature for different pitches employed in Example 3.

DETAILED DESCRIPTION OF THE INVENTION

Figure 1:
FIG. 1 is a photomicrograph under a scanning electron microscope showing the structure in cross-section of a carbon microballoon obtained in Example 1.

This invention is directed to a process for preparing carbon microballoons by starting with coal and petroleum pitches.

The pitches suitable for use in the preparation of the carbon microballoons according to the present invention may preferably have a softening point in the range between 60° C. and 320° C. The pitches having the softening point lower than 60° C. are liable to mutually fuse in the foaming step and undesirably difficult to render infusible and carbonize. The pitches with the softening point higher than 320° C. are too expensive to attain the object of economically preparing carbon microballoons.

The pitches used in accordance with the present invention may generally contain 40 to 65% of benzene insoluble (BI) components and up to 0.1% of quinoline insoluble (QI) components. The pitch may preferably contain up to 0.05%, and more preferably, up to 0.01% of the quinoline insoluble components. The pitch containing less than 40% of the BI components may undergo a quite large decrease in its viscosity when mixed with a low-boiling solvent, and the resulting pitch-solvent mixture can not be pulverized into the desired particle size. The pitch containing more than 65% of the BI component is too viscous to obtain a uniform mixture with the low-boiling solvent. The pitch containing more than 0.1% by weight of the QI components does not undergo uniform expansion. Therefore, irregularly-shaped pitch particles comprising such a pitch do not foam into spherical microballoons.

The pitch employed in the present invention may also have a viscosity of at most $1.0 \times 10^5$ poise at 255° C. and at least 100 poise at 290° C. The pitch having a higher viscosity than these may require higher foaming temperatures. Most of the solvent included in the pitch will then be evaporated before the pitch reaches its foaming temperature failing to produce spherical microballoons.

The pitch suitable for use in the preparation of the carbon microballoons according to the present invention which meets above-specified requirements may be obtained by subjecting a starting pitch to a predetermined pretreatment.

The starting pitch is adjusted to contain less than 5% of the QI components. The starting pitch is then heated to a temperature of higher than 400° C., for example, 430° C., to generate a mesophase pitch and spherulites. When the starting pitch is heated to a temperature of lower than 400° C., the mesophase pitch is little formed. The high-molecular weight components then can not be removed in the subsequent step.

The thus heat treated starting pitch is then subjected a solvent extraction to extract low-molecular weight components and remove high molecular-weight components including the mesophase pitch and the spherulites as well as free carbon. The solvents which may be used for the solvent extraction include methylnaphthalene, naphthalene, indene alikylbenzene, and the like, among which the methylnaphthalene being most preferable.

The resulting filtrate is then heat-treated to leave the pitch, which is used for the preparation of the carbon microballoons in accordance with the present invention. Such a heat treatment may preferably be carried out at a temperature of up to 420° C. to avoid further formation of the high-molecular weight components and the mesophase pitch through polycondensation of low-molecular weight components. The thus pretreated pitch, wherein the high-molecular weight components including mesophase pitch and spherulites as well as free carbon have been satisfactorily removed, may uniformly be mixed with the low-boiling organic solvent. A uniform mixture of the pitch and an appropriate amount of the solvent may have a suitable viscosity for further pulverization.

Without the above-described pretreatment, both the high-molecular weight components and the free carbon will be left unremoved within the pitch. Such a pitch does not uniformly mix with the low-boiling organic solvent since the mesophase pitch is incompatible with the low-boiling organic solvent. The non-uniform pitch-solvent mixture, when pulverized, may result in particles containing insufficient amount of the solvent to cause foaming having the non-mixed mesophase pitch left therein. Since the mesophase pitch portion does not foam, the yield of the microballoon will markedly be reduced. Further, such particles are difficult foam since their viscosity is too high. When the foaming temperature is elevated to induce the foaming of such high-viscosity pitches, the solvent included therein will be volatilized to further increase the viscosity, resulting in a significantly decreased yield of the spherical microballoons.

The thus prepared pitch is mixed with the foaming agents. The foaming agents used in the present invention are low-boiling organic solvents compatible with the pitch, preferably having a molecular weight very different from that of the pitch. Examples of the solvents include aromatic hydrocarbons such as benzene, toluene, xylene, naphthalene, etc. and aliphatic hydrocarbons and alicyclic hydrocarbons alone or in admixture. The amount of an organic solvent mixed as the foaming agent with the pitch may vary with the particular type of pitch employed as the starting material and the desired density of the resultant microballoons. However, it is quite important to add the organic solvent or foaming agent to the pitch such that the mixture may reach a sufficient viscosity for atomizing.

The process for preparing carbon microballoons is hereinafter described in further detail.

First of all, it is quite important to thoroughly and uniformly mix the low-boiling organic solvent or foaming agent with the pre-treated pitch. Insufficient mixing at this stage results in irregular foaming or expanding in the foaming step, eventually failing to obtain the desired microballoons. The amount of the foaming agent or organic solvent required for foaming may be at least 0.5% by weight of the mixture. The upper limit is set to 20% by weight because pitch mixture having a higher content of foaming agent are difficult to pulverize. Sufficient mixing of the foaming agent with the pitch may be accomplished by agitating at a temperature from 100° C. to 350° C. in an inert atmosphere or under vacuum for an appropriate time, preferably 20 min. to 150 min.

A conventional pulverizer may be employed in the pulverizing step to atomize the pitch-organic solvent mixture. The pulverized particles may be irregularly shaped and need not to be made spherical in shape, but rather should have a granulometry falling within the range from 4 mesh (4,760 μm) to 425 mesh (32 μm) ASTM. Particles larger than 4 mesh (4,760 μm) are very difficult to provide with foaming conditions capable of obtaining microballoons. Since below 425 mesh (32 μm) are too small to obtain individual particles because of mutual fusion caused by static attraction and other factors.

In the foaming step, pitch microballoons are obtained by flash heating the pulverized solvent-containing pitch at a temperature higher than the boiling point of the solvent, whereby expansion pressure of said solvent and surface tension of said particles coact to form hollow, spherical carbon microballoons. Foaming may be carried out separately for each particle size range, if necessary. Voids may be controlled by selecting suitable temperature conditions for foaming. Microballoons with a bulk density in the range from 0.05 g/cm$^3$ to 0.7 g/cm$^3$ may thus be obtained. It is to be noted that when the foaming temperature is too high, once formed microballoons will burst or mutually fuse, failing to obtain the desired microballoons.

Prior to rendering microballoons infusible, they may be sorted by size, if necessary. The microballoons are sorted by removing too large and too small microballoons so as to obtain a fraction of microballoons having a narrower distribution of particle size.

In rendering microballoons infusible, the microballoons resulting from the foaming step are exposed to an oxidizing gas or liquid at a temperature lower than the softening point of the pitch to oxidize the pitch moiety. Typical oxidizing gases include air, nitrogen dioxide ($NO_2$), nitrogen monoxide (NO), sulfur dioxide ($SO_2$), ozone ($O_3$) and the like. Aqueous solutions of potassium permanganate ($KMnO_4$), sulfuric acid ($H_2SO_4$), and nitric acid ($HNO_3$) are typical oxidizing liquids. Among these, air is most preferred for economic reasons.

In the carbonizing step, the infusible pitch microballoons are sintered at a temperature in the range from 600° C. to 2,000° C. in a non-oxidizing atmosphere for a sufficient time to carbonize, preferably 20 min. to 300 min.

The carbon microballoons thus obtained have a particle size in the range from 30 to 10,000 μm, and a bulk density of 0.05 to 0.7 g/cm$^3$.

Examples of the present invention will be given below by way of illustration and not by way of limitation. In the Examples, percentage of foaming is a percentage of the number of the particles wherein angularly edges are smoothened and rounded off by melting in relation to the number of the original irregularly shaped particles having angularly edges; sphericity is a ratio of the minor diameter to the major diameter of the foamed microballoon; and percentage of the spherical microballoons is a percentage of the number of the microballoons having the sphericity of at least 0.9 in relation to the number of the foamed microballoons.

EXAMPLE 1

An autoclave equipped with an agitating blade and having an internal volume of 1 liter was charged with 600 g of a pitch having a softening point of 176° C. and a benzene-insoluble content of 51%, a quinoline-isoluble content of 0.03% and 60 g of benzene. After air in the interior of the autoclave was thoroughly purged with nitrogen gas, the temperature was raised to 150° C. over 30 min. and maintained at 150° C. for 2 hours, during which the mixture was agitated at 500 r.p.m. The benzene-containing pitch thus prepared was pulverized through a pulverizer into particles having a benzene content of 3.2%, with 96% of the particles having a size in the range from 325 mesh to 8 mesh. The solvent-containing pitch particles were introduced into a blowing oven having an internal volume of 18,000 cm$^3$ at 130° C. to cause foaming. The pitch microballoons thus obtained had a bulk density of 0.31 g/cm$^3$ and a sphericity of 0.98.

The pitch microballoons were admitted into an electric furnace having an internal volume of 8,000 cm$^3$. While air was passed at 30 l/min, the temperature was raised from room temperature to 300° C. over for 4 hours to render the microballoons infusible. The infusible pitch microballoons were sintered in the same electric furnace by raising the temperature from 300° C. to 1000° C. over 4 hours and maintaining at 1000° C. for 1 hour while argon gas was passed at 20 l/min. The thus obtained carbon microballoons had a bulk density of 0.21 g/cm$^3$ and a sphericity of 0.96.

FIG. 1 is a photomicrograph under a scanning electron microscope showing the structure in cross-section of one of the thus obtained carbon microballoons. It is seen that each microballoon has a plurality of degassing holes in its shell.

EXAMPLE 2

The mixing and pulverizing procedures were repeated in the same equipment and conditions as in Example 1 except that 60 g of toluene was used instead of benzene as the foaming agent.

The pulverized pitch contained 81% of particles having a size in the range from 200 mesh to 20 mesh and had a toluene content of 4.9%. The solvent-containing pitch particles were flash heated at 150° C. for foaming, obtaining pitch microballoons having a bulk density of 0.4 g/cm$^3$ and a sphericity of 0.92.

The pitch microballoons were rendered infusible and then carbonized in the same equipment and conditions as in Example 1, obtaining carbon microballoons having a bulk density of 0.4 g/cm$^3$ and a sphericity of 0.92.

Figure 2:
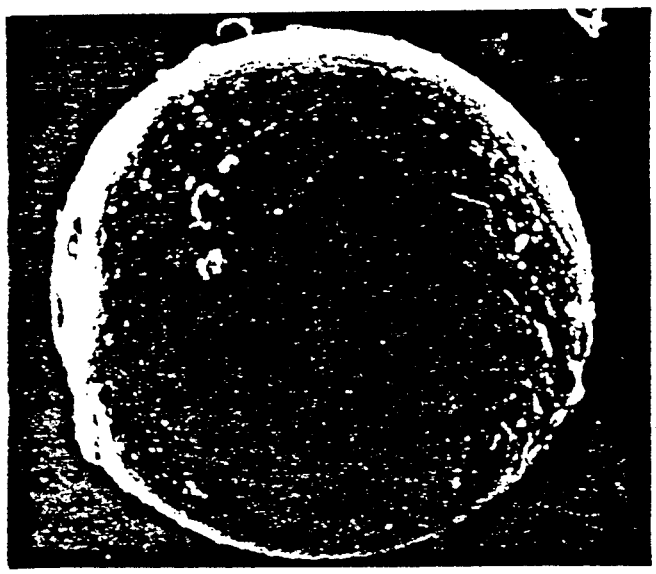
FIG. 2 is a photomicrograph under a scanning electron microscope showing a carbon microballoon obtained in Example 2.

FIG. 2 is a photomicrograph under a scanning electron microscope showing the thus obtained carbon microballoon. As is evident from the photomicrograph, the carbon microballoon is a spherical particle having a smooth surface structure.

EXAMPLE 3

The percentage of foaming as well as the percentage of the spherical microballoons obtained were examined in relation to the foaming temperature by using different pitches as listed in Table 1.

Pitch No. 3A is a pitch employed in the process according to the present invention which has been subjected to a pretreatment to remove the free carbon as well as the high-molecular weight components including the mesophase pitch. Pitch Nos. 3B through 3E are the pitches falling outside the scope of the present invention which have not been subjected to any pretreatment and thus containing the high-molecular weight components unremoved therein. Among these, pitch Nos. 3B and 3C are low-viscosity pitches containing a trace amount of the free carbon, while pitch Nos. 3D and 3E are highly viscous pitches having the free carbon included therein.

TABLE 1

| Pitch No. | 3A | 3B | 3C | 3D | 3E |
|---|---|---|---|---|---|
| BI components % | 50.7 | 46.0 | 54.5 | 58.5 | 69.4 |
| QI components % | trace* | 0.47 | 12.2 | 19.8 | 16.0 |
| Free carbon, % | trace* | trace* | 0.01 | 5.9 | 7.3 |
| Softening points °C. | 220 | 207 | 226 | 245 | 270 |
| Viscosity poise | | | | | |
| at 225° C. | 6 × 10$^4$ | 2 × 10$^3$ | 1 × 10$^4$ | <1 × 10$^5$ | <1 × 10$^5$ |
| at 290° C. | 160 | >100 | >100 | 341 | 6 × 10$^3$ |
| Pretreatment | Yes | No | No | No | No |

*The term "trace" designates a content of less than 0.001%.

An autoclave equipped with an agitating blade and having an internal volume of 1 liter was charged with 600 g of the pitch shown in Table 1 and 80 g of benzene. After completely purging air in the autoclave with nitrogen gas, the temperature was raised to 200° C. for over 120 min. and maintained at 200° C. for 2 hours, during which the mixture was agitated at 400 r.p.m. The benzene-containing pitch thus prepared was pulverized through a pulverizer into two types of particles having particle sizes of 149 micrometers and 250 micrometers. The benzene content of these particles were 4.6% by weight.

The thus obtained particles were foamed, infusibilized, and sintered by repeating the procedure of Example 1. The resulting particles were examined for the percentage of foaming as well as the percentage of the spherical microballoons in relation to the foaming temperature. The results are shown in FIGS. 3a and 3b, wherein FIG. 3a demonstrates the results obtained by using the pitch-solvent mixture particle having the particle size of 149 micrometers while FIG. 3b demonstrates those obtained by using the pitch-solvent mixture particle having the particle size of 250 micrometers.

As demonstrated in FIGS. 3a and 3b, the pitch-solvent mixture particles prepared from pitch Nos. 3B and 3C, which are the pitches containing substantially no free carbon, foamed at lower temperatures than other pitch-solvent mixture particles. As demonstrated in FIG. 3a, the percentage of spherical microballoons obtained were quite unfavorable at the smaller particle size. The range of the foaming temperature resulting in a high yield of spherical carbon microballoons was also quite narrow.

Figure 4A:
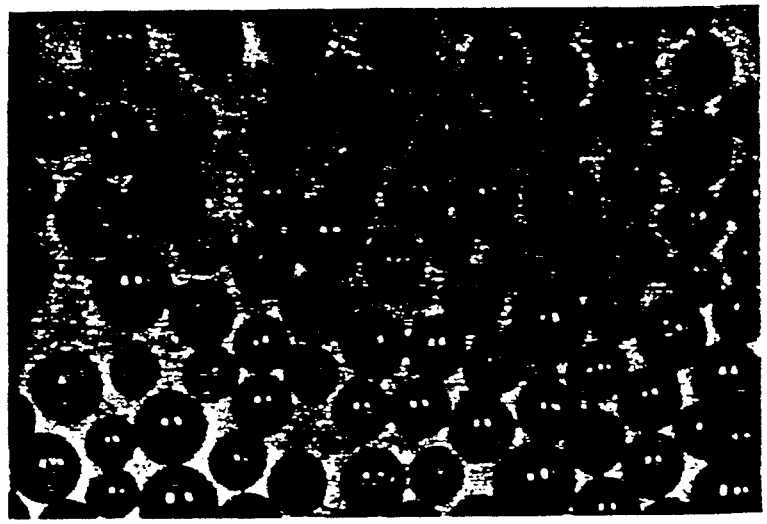
FIGS. 4a, 4b and 5 are photomicrographs under a scanning electron microscope showing carbon microballoons obtained in Example 3 from pitch No. 3A, Example 3 from pitch No. 3B, and Example 4, respectively.
Figure 4B:
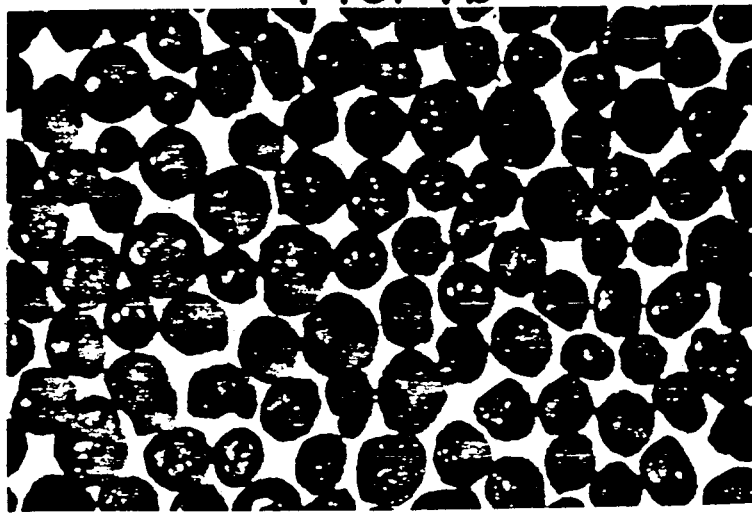

Further, even when the pitch-solvent mixture particles are successfully foamed into spherical microballoons, the microballoons prepared from the free carbon-free pitches having a low viscosity are liable to be either fused during the subsequent infusibilizing step or collapsed during the cooling step due to their weak thin shells, failing to produce the final spherical, hollow carbon microballoons. FIG. 4b demonstrates a photomicrograph of the carbon microballoons prepared from pitch No. 3B, wherein the solvent-pitch mixture particles having the solvent content of 4.6% by weight were foamed at 170° C. Note that most of the carbon microballoons are collapsed with few microballoons remaining spherical. .

On the other hand, the pitch-solvent mixture particles prepared from the free-carbon rich and viscous pitch Nos. 3D and 3E foamed at higher temperature than other pitch-solvent particles. Since the solvent is volatilized at such higher foaming temperature and the particles become even more viscous, the percentage of spherical microballoons obtained are reduced.

In contrast to the microballoons prepared from pitch Nos. 3B through 3E, the microballoons prepared by using the pitch No. 3A according to the present invention could achieve a high percentage of foaming as well as a high percentage of spherical microballoons obtained over a wide range of the foaming temperature. Further, the once foamed microballoons are quite stable in the subsequent infusibilizing, sintering and cooling steps. FIG. 4a demonstrates a photomicrograph of the carbon microballoons prepared from pitch No. 3A. Note that the carbon microballoons are quite spherical with few microballoons collapsed.

EXAMPLE 4

An autoclave having an internal volume of 20 liters was charged with 15 kg of a pitch containing 3.4% by weight of quinoline insoluble components having a softening point of 86.7° C. The pitch was heat treated at a temperature of 410° C. under agitation at 200 r.p.m. while nitrogen gas was passed at 2 l/min. to generate spherulites having an average diameter of 14 micrometers. Free carbon was found to agglomerate around the thus generated spherulites.

To an 8 kg portion of the thus heat treated pitch, 8 kg of naphthalene oil primarily comprising alpha- and beta-naphthalene was added and mixed. The mixture was subjected to a conventional filtration under pressure to remove the free carbon as well as the heavy components including the spherulites. The resulting filtrate contained a trace amount of quinoline insoluble components.

An autoclave having an internal volume of 20 liters was charged with 18 kg of the filtrate and heated to 390° C. for 2 hours with nitrogen gas bubbled into the solution to remove light components and leave the pitch.

Approximately 4.3 kg of hard pitch was obtained, wherein the benzene insoluble component comprised 56.3%, the quinoline insoluble component comprised 0.04%, the viscosity was $10^4$ poise at 250° C. and 230 poise at 290° C., and the softening point was 224° C.

A 600 g portion of the thus prepared pitch was crushed and charged in an autoclave having an internal volume of 1 liter together with 10% by weight of toluene. After purging the thus charged autoclave with nitrogen gas twice, the temperature was raised to 200° C. and maintained at this temperature for 1 hour while the mixture was agitated at 500 r.p.m. The resulting pitch-solvent mixture was pulverized with a roll crusher and the particles having a particle size in the range of from 100 to 150 mesh were sorted. The sorted particles were charged in a rotary drier and heated to 200° C. to cause foaming. 90% of the resulting pitch microballoons had a particle size in the range of 150 to 80 mesh.

Figure 5:
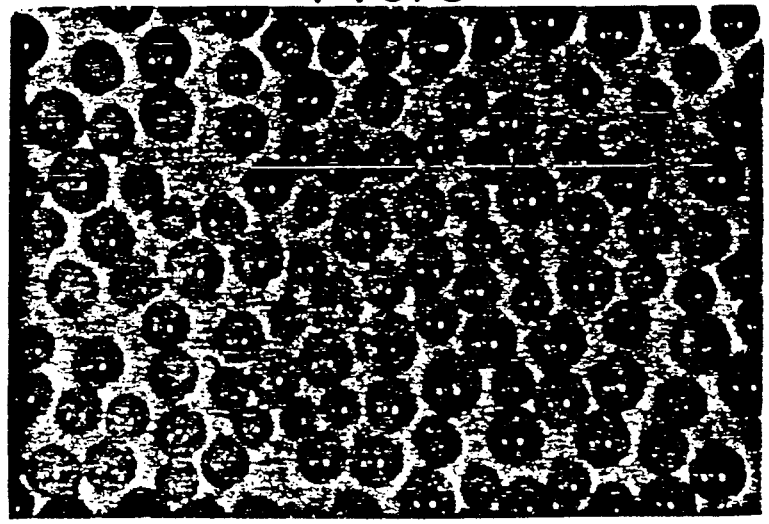

The thus obtained pitch microballoons were rendered infusible by heating the microballoons to 290° C. over 3 hours in air and maintaining at that temperature for 1 hour. The infusibilized microballoons were sintered by raising the temperature to 1,000° C. at a rate of 10° C./min. The thus obtained carbon microballoons had a bulk density of 0.10 g/cm$^3$. A photomicrograph of the thus obtained carbon microballoons are shown in FIG. 5.

As demonstrated in FIGS. 1, 2, 4a and 5, the carbon microballoons according to the present invention are spherical in shape. Such spherical hollow microballoons according to the present invention are obtained by using the pretreated pitch wherein the free carbon as well as the high-molecular weight components including the mesophase pitch and spherulites are removed. The pretreated pitch may uniformly be mixed with the organic solvent providing an appropriate viscosity for the subsequent foaming by flash heating to produce hollow and spherical carbon microballoons. The foamed microballoons prepared from the pretreated pitch are also quite stable in the following infusibilizing, sintering and cooling steps. Accordingly, the present invention enables a stable, large-scale production of the high-quality carbon microballoons at high yield.

I claim:

1. Process for preparing carbon microballoons, consisting of the steps of:
    admixing a pitch with a low-boiling organic solvent to form a pitch-solvent mixture in which the solvent is present in an amount of 0.5 to 20% by weight;
    said pitch containing 40 to 65% by weight of BI (benzene insoluble) components and up to 0.1% by weight of QI (quinoline insoluble) components, and having a softening point in the range of 60° to 320° C.;
    forming said pitch-solvent mixture containing 0.5 to 20% by weight solvent into irregularly-shaped particles having a granulometry comprised between 4 mesh (4,760 μm) and 425 mesh (32 μm);
    flash heating said irregularly-shaped particles containing 0.5 to 20% by weight solvent at a temperature higher than the boiling point of said low-boiling organic solvent but below said softening point to cause foaming, whereby expansion pressure of said solvent and surface tension of said particles coact to form hollow, spherical pitch microballoons;
    treating said microballoons with an oxidizing gas or liquid to make them infusible; and
    sintering the infusible microballoons in a non-oxidizing atmosphere for carbonization.

2. Process according to claim 1, wherein said pitch is prepared by heat treating a starting pitch at a temperature of at least 400° C. to form a mesophase pitch, removing high-molecular components comprising the mesophase pitch by solvent extraction, and further heat treating a filtrate resulting from said solvent extraction at a temperature of up to 420° C. to remove the solvent and leave the pitch.

3. Process according to claim 1, wherein said irregularly-shaped particles are formed by atomization of said pitch-solvent mixture.

4. Process according to claim 1, wherein said admixing is effected at a temperature from 100° C. to 350° C., and for a time of 20 to 150 minutes.

* * * * *